United States Patent
Huang

(10) Patent No.: US 8,369,098 B2
(45) Date of Patent: Feb. 5, 2013

(54) BRACKET FOR SUPPORTING MOTHERBOARD

(75) Inventor: Fa-Sheng Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 302 days.

(21) Appl. No.: 12/859,290

(22) Filed: Aug. 19, 2010

(65) Prior Publication Data

US 2012/0026683 A1    Feb. 2, 2012

(30) Foreign Application Priority Data

Jul. 28, 2010  (CN) .......................... 2010 1 0239165

(51) Int. Cl.
  *H05K 5/00* (2006.01)
  *H05K 7/00* (2006.01)
  *H05K 1/00* (2006.01)
  *H05K 3/30* (2006.01)
  *B23Q 1/00* (2006.01)

(52) U.S. Cl. .................. 361/756; 361/748; 361/679.02; 361/679.4; 29/832; 269/47; 269/48.1

(58) Field of Classification Search ............. 361/679.02, 361/679.4, 748, 756; 29/832; 269/47, 48.1
See application file for complete search history.

(56) References Cited

U.S. PATENT DOCUMENTS

| | | | | |
|---|---|---|---|---|
| 5,516,089 A * | 5/1996 | Seniff et al. | ................... | 269/304 |
| 5,661,640 A * | 8/1997 | Mills et al. | ................... | 361/801 |
| 5,838,538 A * | 11/1998 | Yee | ........................... | 361/679.6 |
| 6,164,634 A * | 12/2000 | Farlow | ......................... | 269/47 |
| 6,267,254 B1 * | 7/2001 | Chen | ........................... | 211/26 |
| 6,331,940 B1 * | 12/2001 | Lin | ............................ | 361/785 |
| 6,378,857 B1 * | 4/2002 | Taylor | ......................... | 269/47 |
| 6,385,050 B1 * | 5/2002 | Orita et al. | .................. | 361/759 |
| 6,639,804 B1 * | 10/2003 | Chen | ........................... | 361/719 |
| 6,761,273 B1 * | 7/2004 | Chen et al. | .................. | 211/41.17 |
| 6,874,226 B2 * | 4/2005 | Gleason | ........................ | 29/832 |
| 6,964,581 B2 * | 11/2005 | Chen et al. | .................. | 439/547 |
| 7,012,809 B2 * | 3/2006 | Han et al. | ..................... | 361/759 |
| 7,151,677 B2 * | 12/2006 | Le et al. | ....................... | 361/807 |
| 7,212,400 B2 * | 5/2007 | Fan et al. | .................. | 361/679.58 |
| 7,447,044 B2 * | 11/2008 | Xu | ................................ | 361/803 |
| 7,609,525 B2 * | 10/2009 | Fan et al. | ..................... | 361/752 |
| 2003/0076652 A1 * | 4/2003 | Ahn | ............................ | 361/683 |
| 2004/0196637 A1 * | 10/2004 | Le et al. | ....................... | 361/758 |
| 2004/0223307 A1 * | 11/2004 | Chen et al. | .................. | 361/748 |
| 2005/0276007 A1 * | 12/2005 | Fan et al. | .................... | 361/683 |
| 2006/0044776 A1 * | 3/2006 | Xu | ................................ | 361/803 |
| 2008/0029948 A1 * | 2/2008 | Wu | ............................... | 269/303 |
| 2011/0228462 A1 * | 9/2011 | Dang | ......................... | 361/679.4 |
| 2011/0268152 A1 * | 11/2011 | Becker et al. | ................ | 374/179 |

* cited by examiner

*Primary Examiner* — Bradley Thomas
(74) *Attorney, Agent, or Firm* — Altis Law Group, Inc.

(57) ABSTRACT

A bracket is used to support a motherboard. The bracket includes a framework, a first supporting element, and a second supporting element. The framework includes a front bar, a back bar, and two side bars, corporately bounding a receiving space. The first and second supporting elements are received in the receiving space and connected to the two side bars. A number of through holes corresponding to a number of through holes of the motherboard are defined in the framework, the first supporting element, and the second supporting elements to fix the motherboard on the bracket via a plurality of screw pillars extending through the plurality of through holes of the bracket and the plurality of through holes of the motherboard.

8 Claims, 4 Drawing Sheets

BRACKET FOR SUPPORTING MOTHERBOARD

BACKGROUND

1. Technical Field

The present disclosure relates to brackets and, particularly, to a bracket for supporting a motherboard.

2. Description of Related Art

With developments in electronic technology, electronic components such as central processing units (CPUs) in electronic devices produce increased levels of heat. Therefore, heat dissipation devices need to be larger and heavier to handle the greater demands. When a motherboard bearing the heat dissipation device is tested to check signal quality of the motherboard, the motherboard is supported by a plurality of screw pillars. However, the weight of the heat dissipation device may be too great and warp the motherboard.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
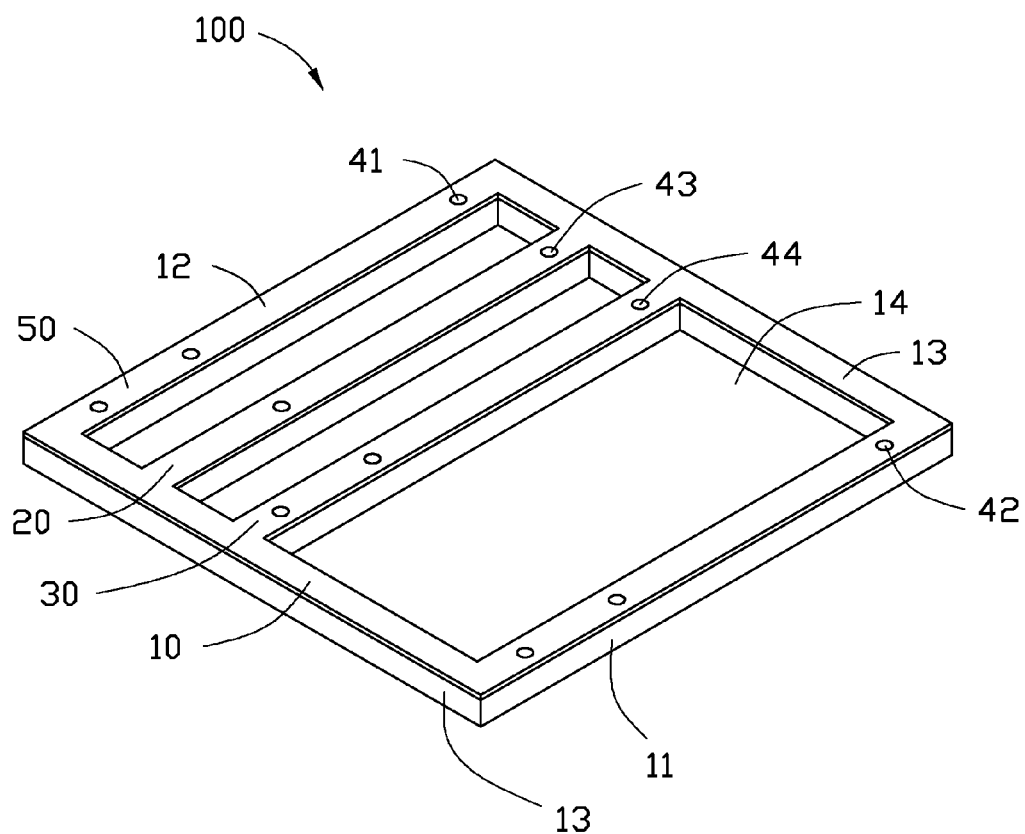
FIG. 1 is an isometric view of a first exemplary embodiment of a bracket.
Figure 2:
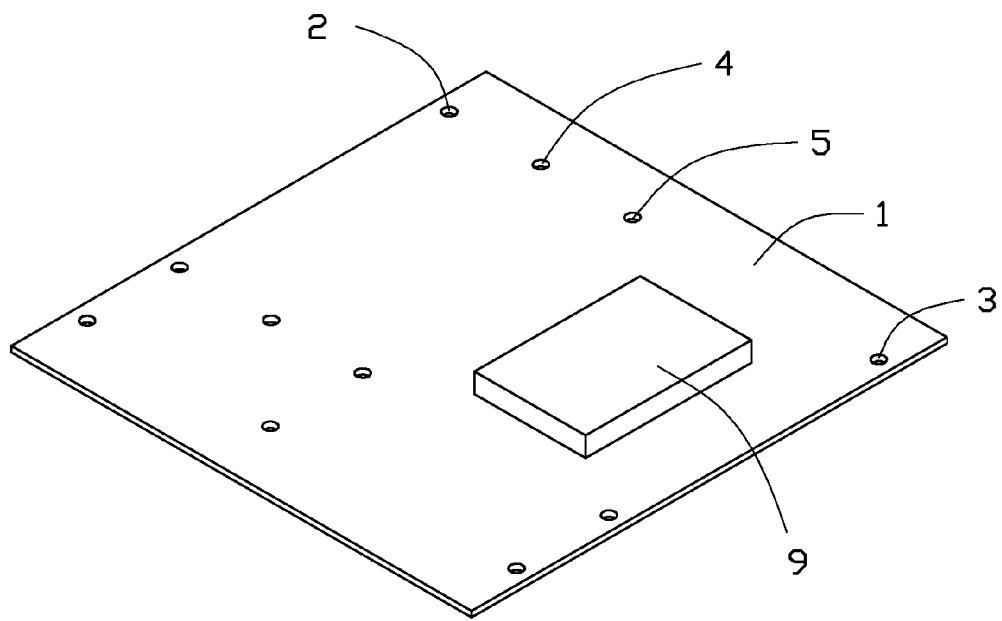
FIG. 2 is an isometric view of a motherboard.

Referring to FIGS. 1 and 2, a first exemplary embodiment of a bracket 100 is used to support a motherboard 1 for testing. A first row and a second row of through holes 2 and 3 are defined in two opposite side edges of the motherboard 1. A third row and a fourth row of through holes 4 and 5 are defined in the motherboard 1 between the first and second rows of through holes 2 and 3, and nearer to the first row of through holes 2 than to the second row of through holes 3. The third to fourth rows of through holes 4 and 5 are arranged in parallel. A heat dissipating element 9 is mounted on the motherboard 1 and located between the second and fourth rows of through holes 3 and 5.

The bracket 100 includes a framework 10, a first supporting element 20, and a second supporting element 30. The framework 10, the first supporting element 20, the second supporting element 30 are made of a rigid material. An outline of the framework 10 may be the same as an outline of the motherboard 1. The framework 10 is rectangular. The framework 10 includes a front bar 11, a back bar 12, and two side bars 13, cooperatively bounding a receiving space 14 thereamong. The first and second supporting elements 20 and 30 are two supporting bars arranged in parallel, and connect the two side bars 13 together. First and second rows of through holes 41 and 42 are defined in the back and front bars 12, 11 corresponding to the first and second rows of through holes 2 and 3 of the motherboard 1. A third row of through holes 43 is defined in the first supporting element 20 corresponding to the third row of through holes 4 of the motherboard 1. A fourth row of through holes 44 is defined in the second supporting element 30 corresponding to the fourth row of through holes 5 of the motherboard 1. Top surfaces of the first and second supporting elements 20, 30 and the framework 10 are coplanar. A layer of electronic insulation material is attached on the top surfaces of the first supporting element 20, the second supporting element 30, the front bar 11, the back bar 12, and the two side bars 13 of the framework 10, excluding positions of the first to fourth rows of through holes 41-44, to insulate the bracket 100 from the motherboard 1.

Figure 3:
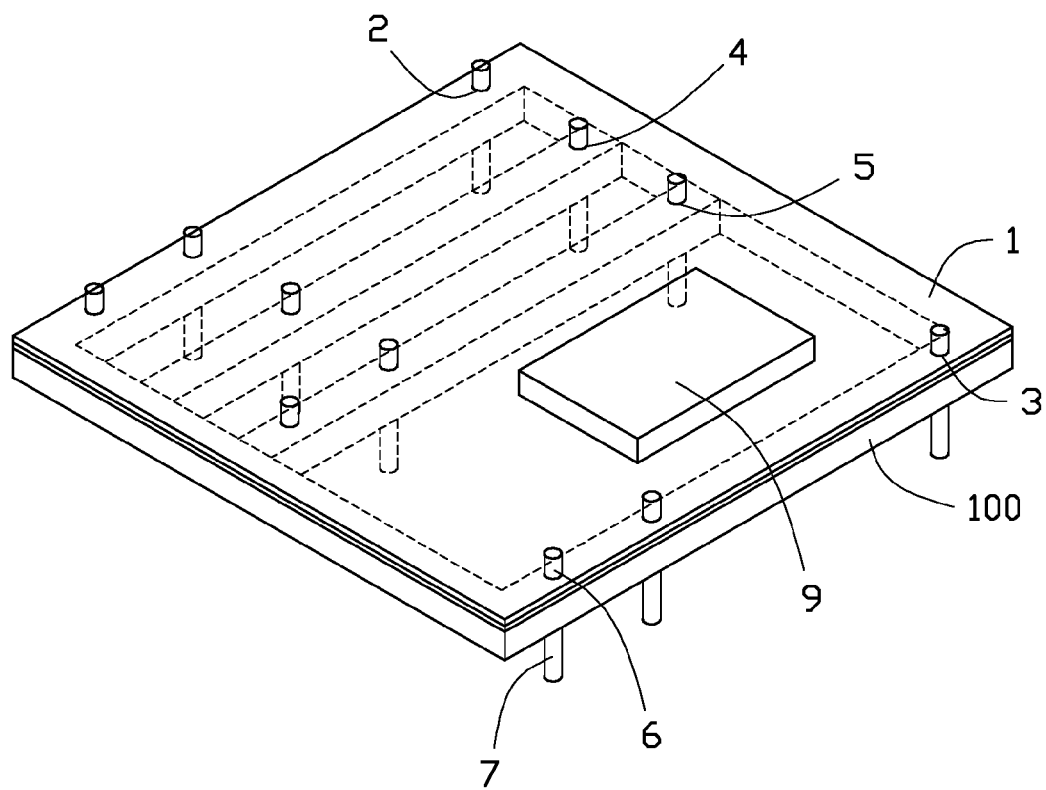
FIG. 3 is an isometric view of the motherboard of FIG. 2 supported by the bracket of FIG. 1.

Referring to FIG. 3, to test the motherboard 1, the motherboard 1 is put on the bracket 100, with the first to fourth rows of through holes 2-5 of the motherboard 1 aligned with the first to fourth rows of through holes 41-44 of the bracket 100. The motherboard 1 is fixed on and supported by the bracket 100 by a plurality of externally threaded pillars 7 extending through the first to fourth rows of through holes 41-44 of the bracket 1 and the first to fourth rows of through holes 2-5 of the motherboard 1 and may be engaged with a plurality of nuts or other internally threaded portions.

Figure 4:
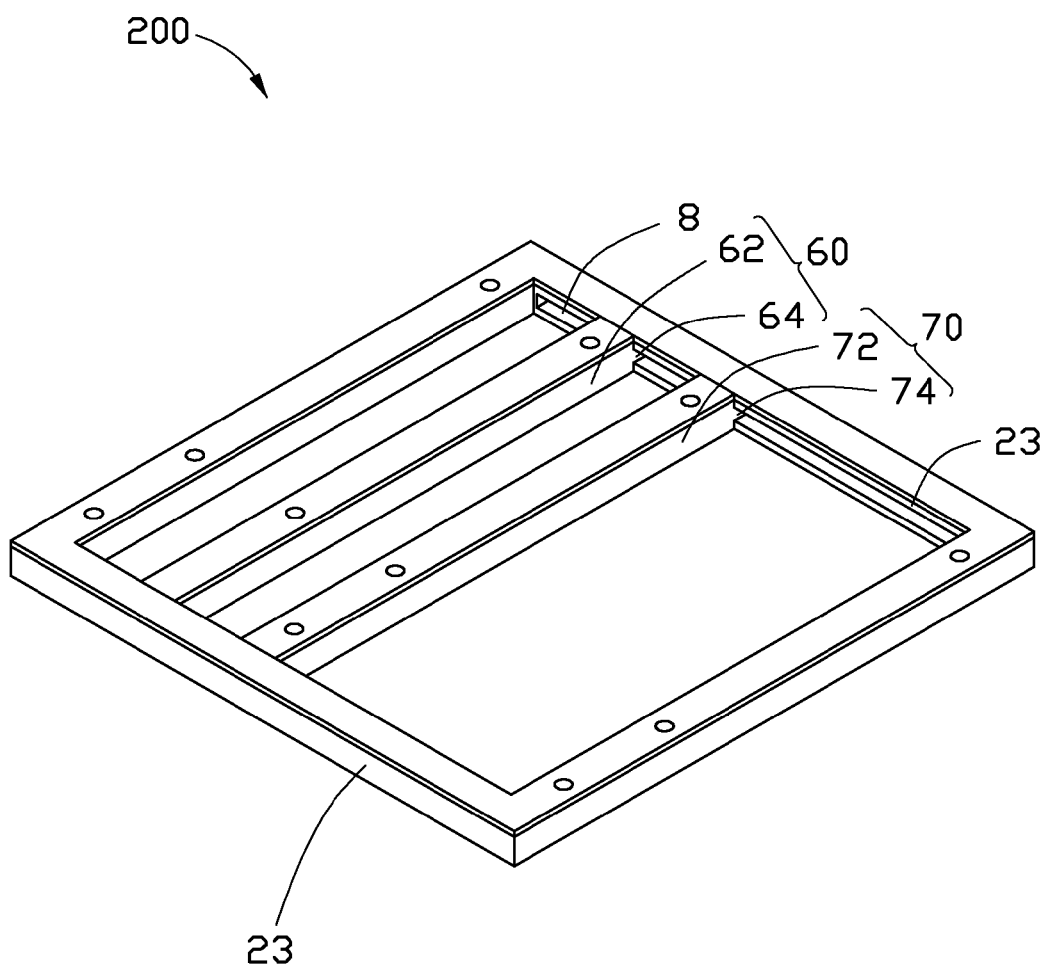
FIG. 4 is an isometric view of a second exemplary embodiment of a bracket.

Referring to FIG. 4, a second exemplary embodiment of a bracket 200 is similar to the first exemplary embodiment of the bracket 100. In the second embodiment, two sliding slots 8 are defined in the inner sides of the side bars 23, respectively. The first supporting element 60 includes a main body 62 and two sliding portions 64 extending from two opposite ends of the main body 62. The second supporting element 70 includes a main body 72 and two sliding portions 74 extending from two opposite ends of the main body 72. The two sliding portions 64 of the first supporting element 60 are slidably received in the sliding slots 8 of the side bars 23 to make the first supporting element align with the third row of through holes 4. The two sliding portions 74 of the second supporting element 70 are slidably received in the sliding slots 8 of the side bars 23 to make the second supporting element 70 align with the fourth row of through holes 5. The sliding portions 64, 74 of the first and second supporting elements 20 and 30 can be fixed in any positions of the sliding slots 8, to suit different types of motherboards.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A bracket to support a motherboard, comprising:
   a framework comprising a front bar, a back bar, and two side bars, cooperatively bounding a receiving space thereamong;
   a first supporting element received in the receiving space and connected between the two side bars;
   a second supporting element received in the receiving space and connected between the two side bars;
   wherein each of the first and second supporting elements comprises a main body and two sliding portions extending from two opposite ends of the main body, two sliding slots are defined in the inner sides of the side bars to slidably receive the two sliding portions of each of the first and second supporting elements; and wherein a plurality of through holes corresponding to a plurality of through holes of the motherboard is defined in the framework, the first supporting element, and the second supporting element, to fix the motherboard on the bracket with a plurality of externally threaded posts extending through the plurality of through holes of the bracket and the plurality of through holes of the motherboard.

2. The bracket of claim 1, wherein the first and second supporting elements are two supporting bars arranged in parallel.

3. The bracket of claim 1, wherein the plurality of through holes of the framework comprises first to fourth rows of through holes, the first and second rows of through holes are defined in the back and front bars corresponding to first and second rows of through holes of the motherboard, the third row of through holes is defined in the first supporting element corresponding to a third row of through holes of the motherboard, the fourth row of through holes is defined in the second supporting element corresponding to a fourth row of through holes of the motherboard.

4. The bracket of claim 3, wherein the third row of through holes is defined in the main body of the first supporting element, the fourth row of through hole is defined in the main body of the second supporting element, and the third and fourth rows of through holes of the framework align with the third and fourth rows of through holes of the motherboard.

5. The bracket of claim 1, wherein the framework and the first and second supporting elements are made of rigid material.

6. The bracket of claim 1, wherein top surfaces of the first and second supporting elements and the framework are coplanar.

7. The bracket of claim 1, wherein a layer of electronic insulation material is attached to the top surfaces of the first and second supporting elements, the front bar, the back bar, and the two side bars, excluding positions of the plurality of through holes of the framework.

8. The bracket of claim 1, wherein an outline of the framework is substantially the same as an outline of the motherboard.

* * * * *